US009260291B2

(12) United States Patent
Caplet et al.

(10) Patent No.: US 9,260,291 B2
(45) Date of Patent: Feb. 16, 2016

(54) SUSPENDED GETTER MATERIAL-BASED STRUCTURE

(75) Inventors: Stephane Caplet, Sassenage (FR); Xavier Baillin, Crolles (FR)

(73) Assignee: COMMISSARIAT A L'ENERGIE ATOMIQUE, Paris (FR)

(*) Notice: Subject to any disclaimer, the term of this patent is extended or adjusted under 35 U.S.C. 154(b) by 505 days.

(21) Appl. No.: 12/494,147

(22) Filed: Jun. 29, 2009

(65) Prior Publication Data

US 2010/0001361 A1 Jan. 7, 2010

(30) Foreign Application Priority Data

Jul. 1, 2008 (FR) ...................... 08 54451

(51) Int. Cl.
| | |
|---|---|
| *B32B 3/24* | (2006.01) |
| *H01L 23/00* | (2006.01) |
| *B81B 7/00* | (2006.01) |
| *H01L 23/26* | (2006.01) |

(52) U.S. Cl.
CPC .............. *B81B 7/0038* (2013.01); *H01L 23/26* (2013.01); *H01L 2924/0002* (2013.01); *Y10T 428/24331* (2015.01); *Y10T 428/24612* (2015.01)

(58) Field of Classification Search
CPC ................... H01L 2924/0002; H01L 2924/00; H01L 23/26; B81B 7/0038; Y10T 428/24331; Y10T 428/24612
USPC ........................................... 257/682, E23.137
See application file for complete search history.

(56) References Cited

U.S. PATENT DOCUMENTS

| | | | | |
|---|---|---|---|---|
| 6,114,806 | A  * | 9/2000  | Itoh ............................... | 313/553 |
| 6,590,280 | B2 * | 7/2003  | Satou et al. ................... | 257/682 |
| 6,897,551 | B2   | 5/2005  | Amiotti | |
| 6,923,625 | B2   | 8/2005  | Sparks | |
| 7,563,635 | B2 * | 7/2009  | Ikushima et al. ............... | 438/55 |
| 2002/0056898 | A1* | 5/2002  | Lopes et al. ................... | 257/682 |
| 2004/0061207 | A1  | 4/2004  | Ding | |
| 2005/0085052 | A1* | 4/2005  | Chen et al. .................... | 438/471 |
| 2006/0164009 | A1* | 7/2006  | Ramamoorthi et al. ....... | 313/547 |
| 2006/0279197 | A1* | 12/2006 | Liu et al. ........................ | 313/495 |

FOREIGN PATENT DOCUMENTS

| | | |
|---|---|---|
| EP | 1518599 A2 | 3/2005 |
| FR | 2567321 A1 | 1/1986 |

(Continued)

OTHER PUBLICATIONS

Gillot, C. et al., "Wafer Level Thin Film Encapsulation for MEMS", 2005 Electronics Packaging Technology Conference, 2005 IEEE, pp. 243-247 (2005).

(Continued)

*Primary Examiner* — Ermias Woldegeorgis
*Assistant Examiner* — Benjamin Tzu-Hung Liu
(74) *Attorney, Agent, or Firm* — Robert E. Krebs; Nixon Peabody LLP (57) ABSTRACT

Getter structure comprising a substrate and at least one getter material-based layer mechanically connected to the substrate by means of at least one support, in which the surface of the support in contact with the substrate is smaller than the surface of a first face of the getter material layer, in which said first face is in contact with the support, and a second face of the getter material layer, opposite said first face is at least partially exposed.

33 Claims, 5 Drawing Sheets

(56) References Cited

FOREIGN PATENT DOCUMENTS

| | | | | |
|---|---|---|---|---|
| GB | 2161322 A | | 1/1986 | |
| JP | 61-27048 A | | 2/1986 | |
| JP | 10-213441 A | | 8/1998 | |
| JP | 2005-197151 A | | 7/2005 | |
| JP | 2005-223294 | * | 8/2005 | .............. H01L 23/26 |
| JP | 2005-223294 A | | 8/2005 | |
| JP | 2005223294 | * | 8/2005 | .............. H01L 23/26 |
| JP | 2006-513046 A | | 4/2006 | |
| JP | 2007-073721 A | | 3/2007 | |
| JP | 2007-160492 A | | 6/2007 | |
| WO | 2004/065289 A2 | | 8/2004 | |

OTHER PUBLICATIONS

French Preliminary Search Report, FR08 54451, dated Mar. 25, 2009.

Office Action in Japanese Patent Application No. 2009-155860 dated Aug. 20, 2013.

* cited by examiner

SUSPENDED GETTER MATERIAL-BASED STRUCTURE

CROSS REFERENCE TO RELATED APPLICATIONS OR PRIORITY CLAIM

This application claims priority of French Patent Application No. 08 54451, filed Jul. 1, 2008.

DESCRIPTION

1. Technical Field

The invention relates to a getter material-based structure. Such a structure can be used in particular in the field of microelectromechanical systems (MEMS) or nanoelectromechanical systems (NEMS), for example accelerometers, gyrometers or any other device intended to be arranged in a high vacuum or controlled pressure environment.

2. Prior Art

A getter material is a material comprising, intrinsically and/or by its microscopic morphology, absorbent and/or adsorbent properties with respect to gaseous molecules, thus capable of forming a chemical gas pump when it is arranged in a closed environment. This type of material can also be used in numerous microelectronic applications such as vacuum tubes, field-effect systems or MEMS or NEMS, in order to produce a high vacuum or controlled pressure environment. In the case of encapsulated MEMS or NEMS, a high vacuum environment formed around the device enables, for example, better operation of the resonant mechanical systems but also of optical systems sensitive to the absorption of light radiation by surrounding gases.

Non-evaporable getter materials are, for example, metals such as titanium, zirconium, hafnium, or binary metal alloys of these three metals. Such a non-evaporable getter material is generally deposited directly on a wall of the chamber in which a chemical pump is to be produced in the form of a thin layer. This material is then thermally activated by heating it through the wall of the chamber on which it has been deposited. Document U.S. Pat. No. 6,923,625 B2 describes the production of such a thin getter material layer.

The pumping capacity of such a thin getter material layer is determined by the surface of the material in contact with the gas to be absorbed. The larger this surface is, the greater the absorption capacity of the getter material is. Document U.S. Pat. No. 6,923,625 B2 indicates in particular that the thin getter material layer can be deposited on a surface having projections. Thus, the surface of the getter material deposited on the lateral walls of the projections enables the total absorbent surface of the getter material in the cavity to be increased.

The major disadvantage of such a thin getter material layer is the power, i.e. the amount of energy and the heating time, necessary for thermal activation thereof.

Document EP 1 518 599 A2 describes the production of two superimposed layers of getter material in which one, deposited on a substrate, is based on a getter material with a low activation temperature. Such a stack of getter materials enables better gas absorption capacities to be obtained and can be thermally activated with a lower activation temperature than that necessary for a single thin getter material layer.

SUMMARY OF THE INVENTIONS

An objective of this invention is to propose a getter material-based structure requiring a lower thermal activation power than that needed to thermally activate the known getter material structures, offering a large gas absorption area and a low thermal inertia.

One embodiment thus proposes a getter structure comprising a substrate and at least one getter material-based layer mechanically connected to the substrate by means of at least one support, in which the surface of the support in contact with the substrate is smaller than the surface of a main face of the getter material layer in contact with the support.

Another embodiment relates to a getter structure comprising a substrate and at least one layer based on at least one getter material mechanically connected to the substrate by means of at least one support, in which the surface of the support in contact with the substrate is smaller than the surface of a first face, or side, of the getter material layer, said first face being in contact with the support, and a second face of the getter material layer, opposite said first face, being at least partially exposed.

The expression "at least partially exposed" means that the second face of the layer is not completely covered by any element, i.e. this face enables gas absorption to take place.

Thus, owing to the support, the getter material is not in direct thermal contact with the substrate. Moreover, given that the surface of the support in contact with the substrate is smaller than that of the getter material layer in contact with the support, the power, i.e. the amount of energy and the heating time, for the thermal activation of the getter material, is therefore lower than the power used for the thermal activation of a getter material layer or a stack of getter material layers deposited directly on a substrate.

Moreover, since the second face is at least partly exposed, that provides a low thermal inertia to the getter structure.

It is possible that the thermal inertia of the getter material layer is at least 10% of the total thermal inertia of the getter structure.

The surface of the portions of the support in contact with the substrate above which the getter material layer is deposited may be smaller than the surface of a main face of the getter material layer in contact with the support.

A portion, for example a maximum of 10%, or 20%, or 30%, or 40%, or 50% of the surface of the main face of the getter material layer, may be in contact with the support formed, for example, by spacers arranged between the getter material and the substrate.

The surface of the first face of the getter material layer in contact with the support may be smaller than the surface of the first face of the getter material layer which is not in contact with the support.

The getter material layer may have the support as the only conductive thermal bridge. Thus, the getter material layer is "thermally-free" because the support is the only element forming a conductive thermal bridge with the getter material layer, the getter material layer being in contact with no other element forming a conductive thermal bridge.

The surface of the support in contact with the getter material layer, i.e. the interface surface between the support and the getter material, may be smaller than the surface of the first face of the getter material layer.

In addition, the surface of the getter material located on the side of the support, but which is not in contact with the support, enables the total absorption surface of the getter material layer to be increased. Indeed, such a structure enables not only the front face of the getter material layer to be used, but also a portion of the rear face of the getter material in order to achieve gas absorption. Thus, for the same amount of getter material, such a suspended getter material structure enables a greater absorption capacity to be obtained than that obtained by a thin layer or a stack of getter material layers deposited directly on the substrate.

Moreover, given that no element covers the second face of the getter material layer, such a getter structure has low thermal inertia, unlike the devices of the prior art in which a getter material layer is covered by an element. Considering this low thermal inertia and the lack of direct thermal contact between the substrate and the getter material layer, it is possible to activate the getter material independently with respect to other elements around the getter material.

The structure may comprise one or more getter material layers, in which said layer(s) may be based on one or more different getter materials.

The substrate may advantageously be based on at least one thermally insulating material such as glass, thus improving the thermal insulation between the substrate and the getter material. In an alternative, the substrate may also be based on other materials such as silicon, covar, and so on.

When at least a portion of the support is based on a conductive material, such as doped silicon, electric insulator may then be arranged between the support and any other conductive materials intended to be in contact with the support.

The support may be at least partially based on a getter material.

The support may comprise at least one spacer arranged between the getter material and the substrate.

The support may comprise at least one structured layer based on at least one resistive material and at least one spacer arranged between the resistive layer and the substrate, and the getter material may be arranged against the resistive layer. Thus, in addition to achieving thermal insulation between the substrate and the getter material, the resistive layer enables thermal activation to be achieved by the Joule effect of the getter material by allowing a current to pass through said resistive material. Advantageously, the resistive layer may be based on tungsten. However, this resistive layer may also be based on gold, molybdenum, or any other material suitable for thermal activation by the Joule effect of the getter material.

It is also possible to integrate a barrier layer, for example based on Pt or WN, between the resistive layer and the getter material layer, thus enabling any diffusion of the getter material to be avoided.

If a resistive layer is used, the spacer may be based on a resistive material. In addition, the resistive layer may have a serpentine structuring pattern. By serpentine, we mean, throughout this document, a continuous line with a number of safety pin-type bends. This pattern may also form a continuous line wound in a spiral. A layer of the resistive material structured according to this pattern enables in particular good heating resistance to be achieved. A large portion of the surface of the getter material layer that is in contact with the resistive material is then heated.

The getter material layer may be structured according to a pattern substantially similar to that of the resistive layer.

In an alternative, the resistive material layer may be produced above the getter material layer, with the getter material layer being arranged between the substrate, or the support, and the resistive layer.

In another alternative, the role of the resistive layer may also be performed by the getter material layer itself. In this case, the thermal activation by the Joule effect may be achieved by passing a current directly into the getter material layers.

The spacer may comprise, in a plane parallel to the plane of the main face of the getter material layer, a cross-section of which the surface may be between around 4 $\mu m^2$ and 25 $\mu m^2$.

This surface is preferably minimized so as to limit the thermal bridge between the getter material layer and the substrate, and therefore the thermal losses. However, the value of this surface may be dependent in particular on the technological process for producing the getter structure, which may require a minimum surface. In addition, the value of this surface is also dependent on the mechanical strength necessary to produce this structure and form good anchorings of the getter material: for example, if deformations of the suspended portions appear due to the effect of stress gradients or due to a buckling effect, a sufficient surface will be chosen so that these deformations do not create new thermal bridges or do not occupy an undesired space. A surface cross-section of between 4 $\mu m^2$ and 25 $\mu m^2$ may correspond to the MEMS technological process with an optimization of the suspended surface of the getter material with respect to the cross-section of the spacers.

In addition, when the support comprises a plurality of spacers, two adjacent spacers may be separated from one another by a distance between around 20 $\mu m$ and 50 $\mu m$, thus providing a good compromise between thermal insulation and mechanical strength. This distance is particularly beneficial when the structure comprises a resistive layer with a thickness between around 0.5 $\mu m$ and 2 $\mu m$.

The support may comprise a peripheral wall of a cavity arranged between the getter material layer and the substrate.

The structure may also comprise at least one opening produced through the getter material layer, capable of forming an access to the cavity. The internal walls of the cavity formed by the getter material layer may therefore also form surfaces capable of absorbing gaseous species.

The structure may also comprise a thermal insulation layer and/or an adhesion layer arranged between the support and the getter material layer and/or between the support and the substrate.

The thermal insulation layer may be based on a semiconductor oxide and/or the adhesion layer may be based on titanium and/or chromium and/or zirconium, or any other material suitable for forming these layers.

The substrate may be based on at least one material transparent to at least one wavelength capable of being absorbed by the getter material. Thus, thermal activation of the getter material may be achieved by means of light beams such as laser beams or infrared radiation passing through the substrate.

Another embodiment relates to a microelectronic system comprising at least one cavity defined by walls and in which at least one microelectronic device is arranged, in which at least one wall of the cavity is formed by a getter structure as described above, and the getter material layer of the getter structure is arranged in the cavity. The microelectronic device may be arranged opposite the second face of the getter material layer.

The microelectronic device may be arranged at a wall of the cavity other than the one formed by the getter structure.

The microelectronic device may comprise at least one MEMS and/or one NEMS.

Another embodiment also relates to a process for producing a getter structure comprising at least the production of a support mechanically connecting a layer based on at least one getter material to a substrate, in which the surface of the support in contact with the substrate is smaller than the surface of a face, capable of being called the main face, of the getter material in contact with the support.

Another embodiment also relates to a process for producing a getter structure, comprising at least the steps of:
  depositing a sacrificial layer on the substrate;

depositing a getter material, forming at least one getter material-based layer so that the sacrificial layer is arranged between the getter material layer and the substrate;

removing at least a portion of the sacrificial layer, forming a support mechanically connecting the getter material layer to the substrate, in which the surface of the support in contact with the substrate is smaller than the surface of a face, called the main face, for example, of the getter material layer, in which said face is in contact with the support.

A second face of the getter material layer, opposite to the face of the getter material layer in contact with the support, may be at least partially exposed.

The deposition of the getter material may also be performed around the sacrificial layer, with the getter material deposited around the sacrificial layer being capable of forming at least a portion of the support.

The process may also comprise, between the step of depositing the sacrificial layer and the step of depositing the getter material, a step of producing at least one opening through the sacrificial layer, in which the deposition of the getter material may also be performed in the opening, with the getter material deposited in the opening being capable of forming at least a portion of the support.

The process may also comprise, between the step of depositing the getter material and the step of removing the portion of the sacrificial layer, a step of producing at least one opening through the getter material, capable of forming access to the sacrificial layer, in which the removal of the portion of the sacrificial layer may be performed at least by means of this opening.

The production of the opening through the sacrificial layer and/or the production of the opening through the getter material may be obtained by at least one lithography step and one etching step.

The remaining portions of the sacrificial layer may form, after the step of removing a portion of the sacrificial layer, at least one portion of the support.

The process may also comprise, between the step of depositing the sacrificial layer and the step of depositing the getter material, a step of structuring the sacrificial layer.

The process may also comprise, between the step of depositing the getter material and the step of removing a portion of the sacrificial layer, a step of structuring the getter material layer.

The process may also comprise at least one step of depositing a layer based on at least one resistive material on the sacrificial layer or on the getter material layer, implemented between the step of depositing the sacrificial layer and the step of depositing the getter material or between the step of depositing the getter material and the step of removing a portion of the sacrificial layer, in which the getter material layer may be arranged on or under the resistive layer.

The process may also comprise, after the step of depositing the resistive layer, a step of structuring the resistive layer and/or a step of producing openings through the resistive layer.

The process may also comprise a step of depositing a barrier layer, for example based on Pt or WN, arranged between the resistive layer and the getter material layer.

The process may also comprise a step of depositing a thermal insulation layer and/or an adhesion layer on the support, implemented between the step of depositing the sacrificial layer and the step of depositing the getter material, and/or on the substrate, implemented before the step of depositing the sacrificial layer.

The deposition of the getter material may be performed by evaporation and/or spraying.

The removal of the portion of the sacrificial layer may be performed by a step of plasma etching, for example in the case of a polymer-based sacrificial layer, or wet etching, for example in the case of a metal material-based sacrificial layer.

The process may also comprise, after the step of depositing the getter material, a step of depositing a protective layer on the getter material, and a step of removing the protective layer implemented after the step of removing a portion of the sacrificial layer.

Another embodiment also relates to a process for producing a microelectronic system, comprising at least the steps of:

implementing a process for producing a getter structure as described above;

closing a cavity defined by walls, for example formed on a substrate, and in which at least one microelectronic device is arranged, in which the getter structure forms a wall of the cavity, and the getter material layer of the getter structure is arranged in the cavity.

BRIEF DESCRIPTION OF THE DRAWINGS

This invention will be easier to understand in light of the description of example embodiments provided purely for indicative and non-limiting purposes, in reference to the appended drawings, in which.

Identical, similar or equivalent portions of the various figures described below have the same numeric references for the sake of consistency between figures.

The various portions shown in the figures are not necessarily shown according to a uniform scale, in order to make the figures easier to read.

The various possibilities (alternatives and embodiments) must be understood as not being mutually exclusive and can be combined with one another.

DETAILED DESCRIPTION OF SPECIFIC EMBODIMENTS

Reference is first made to FIGS. 1 to 4, which show the steps of a process for producing a getter structure 100 according to a first embodiment, as well as a process for producing a microelectronic system 1000, according to a specific embodiment, comprising the getter structure 100.

Figure 1:
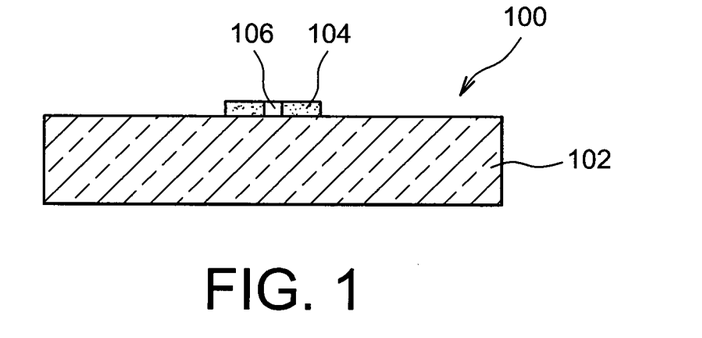
FIGS. 1 to 4 show the steps of a process for producing a getter structure according to a first embodiment, as well as the steps of a process for producing a microelectronic system according to a specific embodiment.

The getter structure 100 is made of a substrate 102, that is for example glass-based. The substrate 102 could also be based on a semiconductor such as silicon, and optionally be covered with an oxide-based layer or any other material capable of achieving thermal insulation of the substrate 102. As shown in FIG. 1, a sacrificial layer 104, for example based on a resin, a polymer such as a photosensitive resin or a metal such as copper or aluminum, is deposited on the substrate 102. Any other sacrificial material can be used to form the sacrificial layer 104, for example an oxide. In general, the sacrificial layer 104 can have a thickness between around 1 μm and 10 μm. The use of resin enables in particular a sacrificial layer 104 with a high thickness to be produced. In addition, when the sacrificial layer 104 is based on resin, it can be advantageous to achieve thermal creep of this sacrificial layer 104, thus enabling the passages of steps of this layer to be smoothed and therefore improving the mechanical strength of the getter material layer subsequently deposited on this sacrificial layer 104. It is also possible to perform a stoving of the sacrificial layer when it is based on resin.

The sacrificial layer 104 is then structured, for example by lithography and optionally etching, in order to receive the deposition of a layer based on at least one getter material. Openings 106 are produced in particular through this sacrificial layer 104. In FIG. 1, a single opening 106 is shown.

Figure 2:
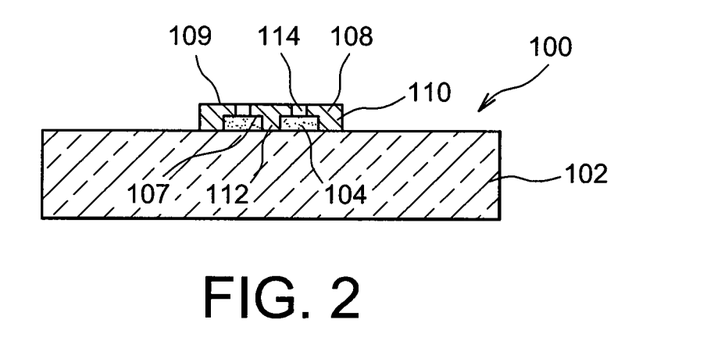

As can be seen in FIG. 2, a getter material is then deposited on the sacrificial layer 104. It is possible to perform a preliminary deposit of a protective sub-layer, for example based on copper and/or chromium, on the sacrificial layer 104, with the getter material layer then being deposited on this protective sub-layer. In this first embodiment, the getter material is titanium, for example deposited by evaporation or spraying, or any other suitable deposition technique. In an alternative, the getter material can be based on chromium and/or titanium and/or zirconium and/or an alloy of these materials, and/or any other material having properties of absorption and/or adsorption of gaseous molecules.

The getter material deposited forms in particular above the sacrificial layer 104, a getter material layer 108 of which a first face 107 is in contact with the sacrificial layer 104. The getter material layer 108 also comprises a second face 109 opposite the first face 107. The faces 107 and 109 form two main faces of the getter material layer 108. In general, the thickness of the getter material layer 108 can be between around 0.2 $\mu$m and 2 $\mu$m. The getter material is also deposited on the substrate 102, around the sacrificial layer 104, forming a peripheral wall 110 on which the layer 108 rests. The peripheral wall 110 is formed here by a continuous portion of getter material, but it could also be formed by a plurality of getter material portions separated from one another, thus capable of forming pillars. Finally, the getter material is also deposited in the openings 106, thus forming spacers 112, or support pillars, between the getter material layer 108 and the substrate 102. In the example of FIG. 2, a single spacer 112 is shown. The peripheral wall 110 and the spacers 112 therefore form a support on which the getter material layer 108 rests.

The getter material layer 108 is then structured by lithography and etching steps, forming in particular openings 114 enabling the sacrificial layer 104 to be accessed. If the structure comprises a protective sub-layer arranged below the getter material layer, the openings 114 are also produced through this protective sub-layer.

Figure 3:
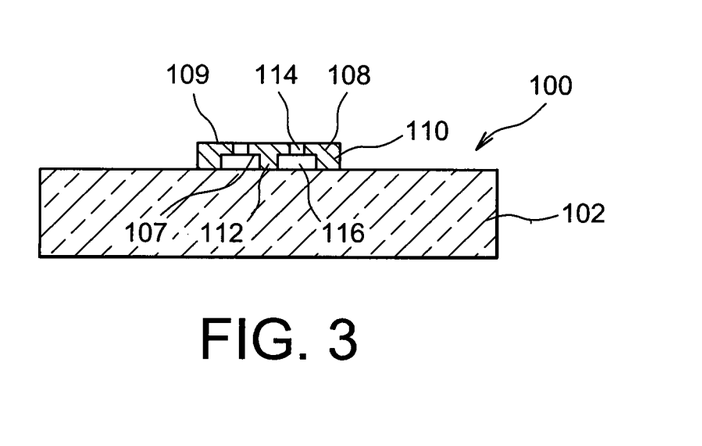

Finally, a selective etching of the sacrificial layer 104 is performed by means of openings 114 previously produced through the getter material layer 108 (see FIG. 3). In the case of a polymer material-based sacrificial layer, the etching is preferably of the ozone plasma type. This etching forms, under the layer 108, a cavity 116 defined in particular by the peripheral wall 110, and thus frees the first face 107 of the getter material layer 108.

We thus obtain a getter material layer 108 that is not in direct contact with the substrate 102, but that is mechanically connected thereto by means of a support formed in this case by the peripheral wall 110 and the spacers 112 also based on the getter material. These spacers 112 can have a cross-section of any shape, or of any geometric shape, of which the dimensions (diameter, sides, etc.) are, for example, between around 2 $\mu$m and 5 $\mu$m. Therefore, in a plane parallel to the plane of the first face 107 of the getter material layer 108 in contact with the peripheral wall 110 and the spacers 112, the spacers 112 can have a cross-section of which the surface is between around 4 $\mu$m$^2$ and 25 $\mu$m$^2$. In addition, the distance separating two adjacent spacers 112 is for example between around 20 $\mu$m and 50 $\mu$m, thus ensuring good mechanical strength of the layer 108 with respect to any risks of buckling of this layer 108 between the spacers 112.

In general, the sacrificial layer 104 can be based on any material capable of being selectively etched with respect to the getter material and/or the materials of the protective sub-layer. The thickness of this sacrificial layer 104 is advantageously proportional, in the case of passages with large steps, to the thickness of the getter material layer 108 desired so as not to form an excessively thin or thick getter material layer, in order to have good mechanical strength after removal of the sacrificial layer. For example, for a getter material layer 108 of which the thickness is between around 1 $\mu$m and 2 $\mu$m, the sacrificial layer 104 can have a thickness between around 0.5 $\mu$m and 1 $\mu$m.

Figure 4:
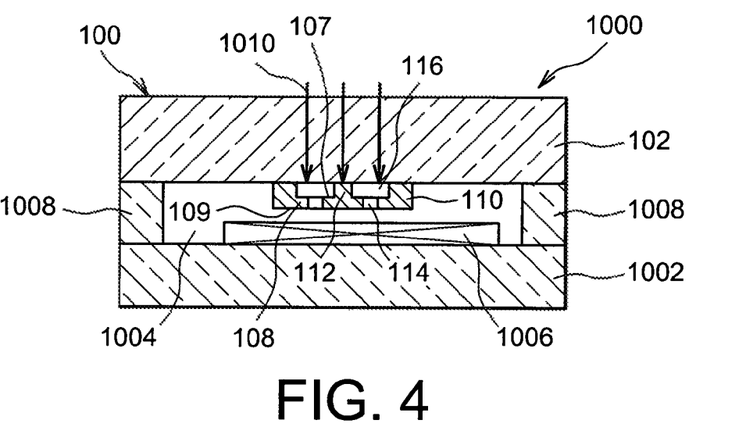

As shown in FIG. 4, the getter structure 100 is integrated on a substrate 1002 comprising a cavity 1004 in which a microelectronic device 1006 such as a MEMS or a NEMS is arranged. The getter structure 100 forms an upper wall of the cavity 1004. The getter material layer 108 is therefore suspended in the cavity 1004, above the device 1006, by means of the support formed by the peripheral wall 110 and the spacers 112. In FIG. 4, the substrate 102 is connected to lateral walls 1008 of the cavity 1004 by glass frit sealing. It is also possible to envisage a configuration associated with anode sealing or molecular bonding. When the substrate 102 is glass-based and the walls 1008 are silicon-based, an anode sealing providing good tightness is preferably produced in order to maintain a vacuum in the interior of the cavity 1004.

The thermal activation is then carried out on the getter material of the structure 100, i.e. in this case the layer 108 as well as the support formed by the peripheral wall 110 and the spacers 112. In the example of FIG. 4, the thermal activation is performed by means of a laser source of which the beams 1010 are shown. In this first embodiment, the substrate 102 is transparent, at least locally at the level of the getter material, to the wavelength of the beams 1010. Thus, the energy provided by these beams is absorbed by the getter material of the structure 100 present in the cavity 1004.

The thermal activation can also be carried out by infrared radiation, for example with a wavelength $\lambda=1$ $\mu$m. In this case, when the getter material layer 108 has a thickness greater than 0.1 $\mu$m, it absorbs around 45% of the light energy. The power of the lamp used to carry out this thermal activation is therefore dependent on the dimensions and the thermal conductivity of the materials of the getter material layer, the spacers and the peripheral wall, as well as the spacing between the spacers, i.e. the density of the spacers supporting the getter material layer 108, and the thermal conductivity of the substrate. For example, for spacers of which the thermal bridge formed by each is equal to around 25 $\mu$W/K (case of a silicon substrate with an oxide-based thermal insulation layer of 1 $\mu$m), and of which the distribution density is equal to around 40,000 spacers/cm$^2$, a lamp of 700 W/cm$^2$ can be used to heat the getter material at a temperature on the order of 300° C. A less powerful lamp can be used when the density of the spacers and/or the thermal conductivity of the spacers and/or of the peripheral wall is reduced, and/or if the thermal conductivity of the substrate is significantly reduced, for example by using a glass substrate instead of a silicon substrate.

This thermal activation enables the getter material to achieve, by means in particular of the first face 107 and the second face 109 of the layer 108 as well as of the support formed by the peripheral wall 110 and the spacers 112, an absorption of the gaseous molecules present in the cavity 1004, and therefore to produce for example a high vacuum in this cavity 1004. This thermal activation of the getter material can be carried out during or after assembly of the structure 100 on the lateral walls 1008. The thermal activation temperature is dependent in particular on the chemical nature of the getter material or the composition of the alloy forming the getter material. This temperature can be between around 200° C. and 500° C., and be maintained for example for several minutes, or one or more hours in order to perform the thermal activation.

It is also possible to carry out a thermal activation by the Joule effect by passing a current directly into the getter material when the thermal conductivity thereof is sufficient.

By comparison with a single getter material layer deposited on a wall of the cavity 1004, this suspended getter material layer 108 structure 100 enable a large absorption surface to be provided owing to the getter material walls of the cavity 116, which are also in contact with the gaseous environment of the cavity 1004, and in particular the first face 107 of the layer 108 and the second face 109 that is left exposed. Moreover, no element transferred on the getter material layer 108 adds thermal inertia to the structure 100 comprising the suspended getter.

In an alternative of the first embodiment described above, it is possible for the getter material not to be deposited around the sacrificial layer 104, not forming a peripheral wall supporting the getter material layer 108. Thus, the getter material layer 108 is supported only by the spacers 112 formed by the getter material deposited in the openings 106 through the sacrificial layer 104.

It is also possible for a protective layer of the getter material to be deposited on the layer 108 and optionally on the peripheral wall 110 during the process of producing the structure 100. Thus, the possible risks of contamination, oxidation and gaseous absorption of the getter material before the confinement of the getter material in the cavity 1004 are minimized. This protective layer can, for example, be based on chromium and/or copper. This protective layer can have a thickness between around 5 nm and 500 nm. This protective layer is removed before the getter structure is used in order to close the cavity 1004, for example by selective chemical etching. However, if this protective layer also serves as a barrier to the getter effect, this layer can then be metal-, oxide- or nitride-based.

It is also possible to use a protective sub-layer deposited between the sacrificial layer and the getter material layer capable of not forming a barrier to the getter effect. Thus, the rear face of the getter layer and the sub-layer opposite the cavity can have a getter function. This protective layer can be preserved or removed, entirely or only partially.

Figure 9:
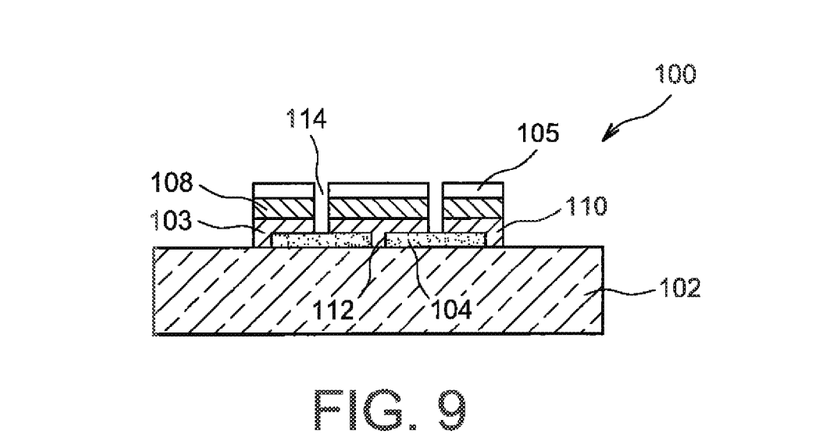
FIG. 9 shows a getter structure according to an alternative of the first embodiment.

FIG. 9 shows the getter structure 100 according to an alternative embodiment. With respect to the getter structure shown in FIG. 3, the getter structure 100 according to this alternative embodiment comprises a protective sub-layer 103, for example chromium- and/or copper-based, deposited on the sacrificial layer 104 prior to the deposition of the getter material layer 108. In addition, the getter material layer 108 is a bilayer comprising the getter material layer and also a protective layer 105 deposited on the getter material layer 108, this protective layer also capable of being chromium- and/or copper-based. The openings 114 have been produced through the getter material layer 108, as well as through the protective layer 105 and the protective sub-layer 103. Finally, in this alternative embodiment, the portions of the sacrificial layer 104 have been preserved. It should be noted that such a protective layer, unlike a massive element arranged against the layer of getter material, does not prevent the getter material to produce a gaseous absorption. Moreover, such a protective layer does not form a conductive thermal bridge with the getter material.

Reference is now made to FIGS. 5 to 8, which show the steps of a process for producing a getter structure 200 according to a second embodiment.

Figure 5:
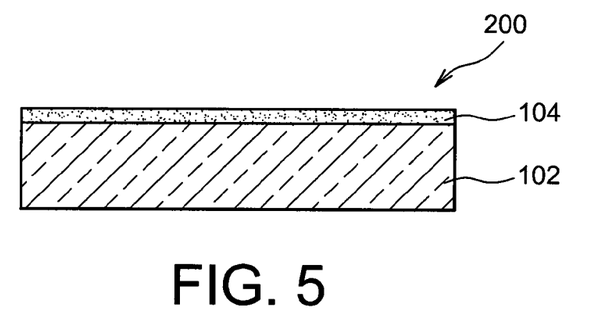
FIGS. 5 to 8 show the steps of a process for producing a getter structure according to a second embodiment.

As shown in FIG. 5, the getter structure 200 comprises the substrate 102, for example similar to that described in association with the first embodiment, on which the sacrificial layer 104 is formed, also similar to that described above.

Figure 6:
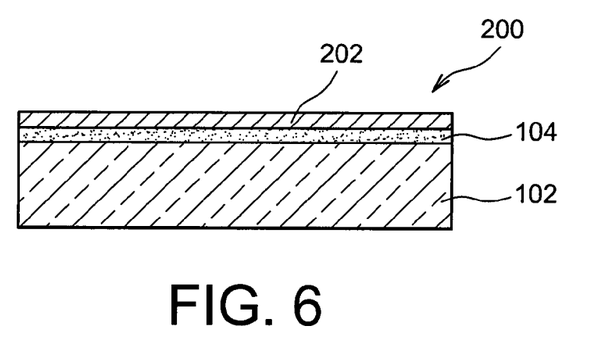

An adhesion layer 202 is then deposited on the sacrificial layer 104 (see FIG. 6). This adhesion layer 202 can be titanium- and/or zirconium- and/or chromium-based. Depending on the material chosen to produce this adhesion layer 202, it can have absorbent properties with respect to gaseous species. The thickness of this adhesion layer 202 can be between around 5 nm and 100 nm.

Figure 7:
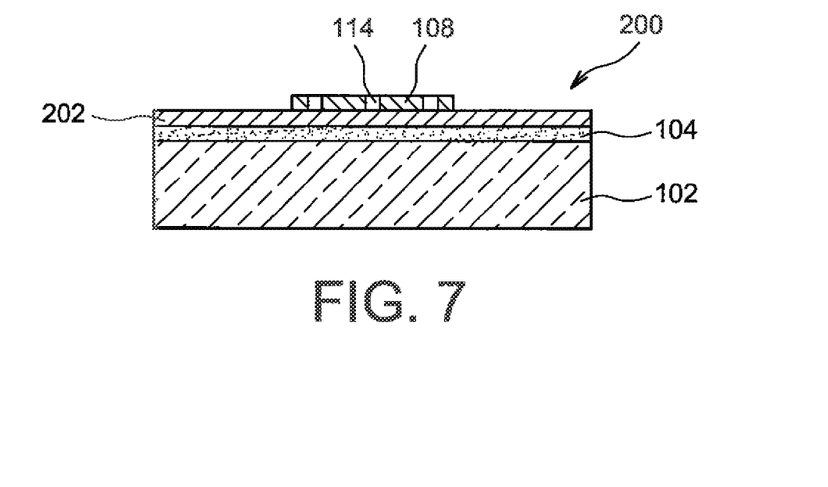

As shown in FIG. 7, a getter material is then deposited on the adhesion layer 202, forming a layer 108 for example similar to that described above in association with the first embodiment. This layer 108 is then structured, thus forming openings 114 through this layer 108. The adhesion layer 202 enables the attachment of the getter material to the sacrificial layer 104 to be improved.

Figure 8:
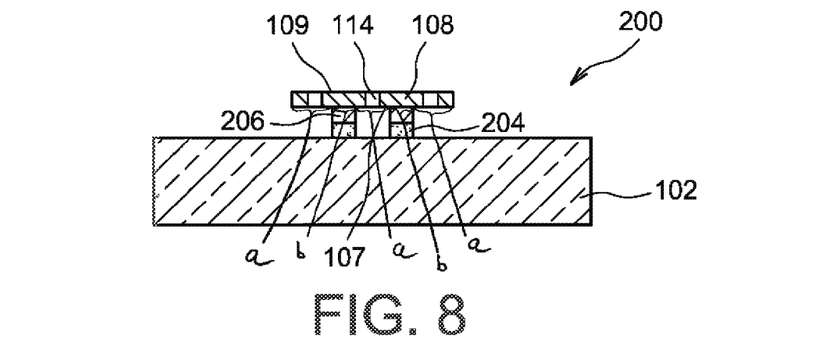

An etching of the sacrificial layer 104 and of the adhesion layer 202 is then performed, in particular through openings 114 formed in the getter material layer 108. The remaining portions of the sacrificial layer 104 thus form spacers 204, on which the remaining portions of the adhesion layer 202 are arranged, forming spacers 206.

As in the first embodiment described above, a getter material layer 108 is therefore obtained which is not in direct thermal contact with the substrate 102, but is connected to it by means of a support formed in this case by the spacers 204 based on the material of the sacrificial layer 104 and the spacers 206 based on the material of the adhesion layer 202. The geometry and distribution of the spacers 204, 206 can be similar to those of the spacers 112 described earlier.

As above, the getter structure 200 is then integrated on a substrate comprising a cavity in which a microelectronic device is arranged, forming a cavity wall. The getter material of the structure 200, i.e. in this case the layer 108, is also thermally activated.

In addition, this suspended getter material structure enables a larger absorption surface to be provided with respect to the getter structures of the prior art because only the surfaces of the layer 108 in contact with the spacers 206 are not part of the total absorption surface of the getter material layer 108. The gas absorption is therefore achieved by the second face 109 of the layer 108, which is left exposed, and by the portions of the first face 107 of the layer 108 that are not in contact with the spacers 206.

Reference is made to FIGS. 10 to 13, which show the steps of a process for producing a getter structure 300 according to a third embodiment.

Figure 10:
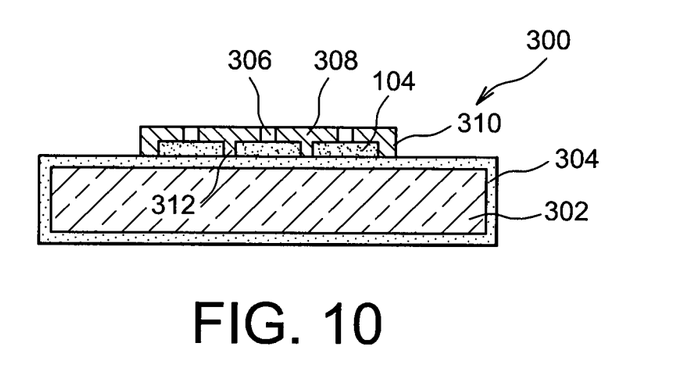
FIGS. 10 to 13 show the steps of a process for producing a getter structure according to a third embodiment.
Figure 11:
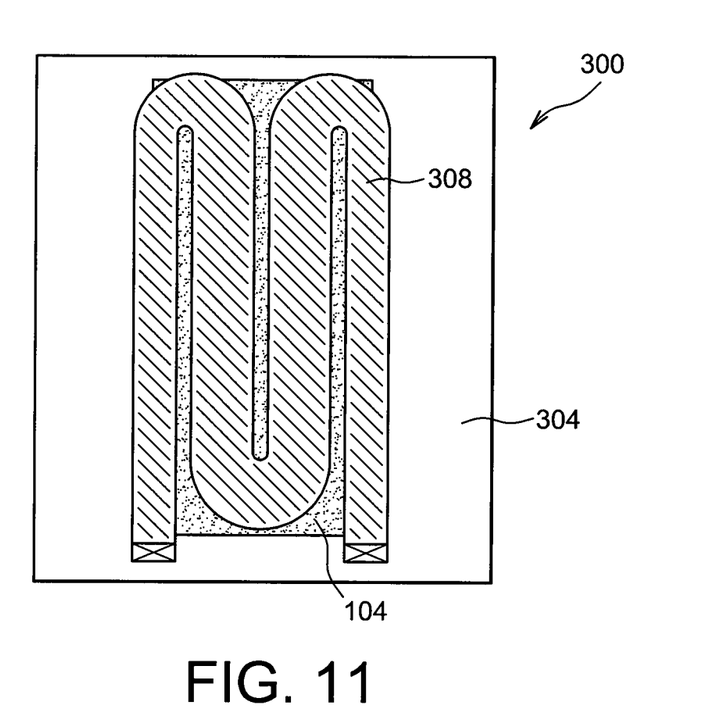

The getter structure 300 comprises a silicon-based substrate 302, on which a silicon oxide layer 304 is formed, producing a thermal insulation layer around the substrate 302 (FIG. 10). As in the first embodiment, a sacrificial layer 104 is formed on the oxide layer 304 and structured, thus forming openings through this layer 104. A material intended to serve as a heating material, for example tungsten or any other suitable material, is deposited on the sacrificial layer 104, thus forming a layer 308. As shown in FIG. 11, this deposition of heating material is structured according to a "serpentine" pattern, i.e. forming a continuous line with a plurality of bends in the form of a series of safety pins. In an alternative, this pattern could also form a continuous line wound in a spiral. Such a structuring enables the layer 308 to achieve good heat resistance. The portions of the heating material deposited next to the sacrificial layer 104 form a peripheral wall 310, and the heating material deposited in the openings formed through the sacrificial layer 104 forms spacers 312 supporting the layer 308 formed by the heating material deposited above the sacrificial layer 104. It is also possible for the peripheral wall 310 not to be present, with the layer 308 then being supported only by the spacers 312.

Figure 12:
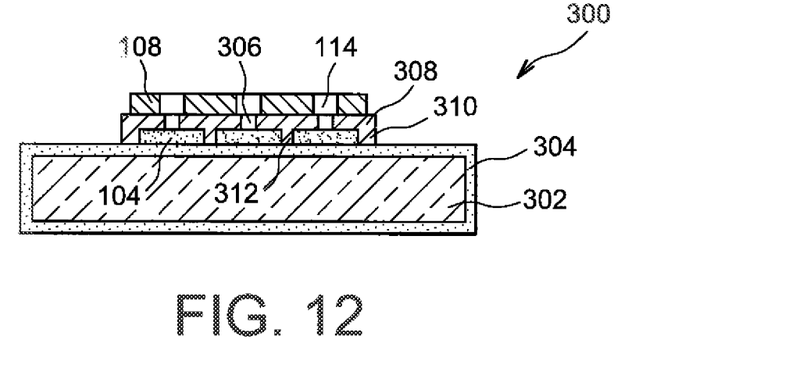

As shown in FIG. 12, a getter material layer 108 is deposited on the heating material layer 308. Optionally, an electrically insulating layer can be deposited on the heating material layer 308 prior to the deposition of the getter material layer 108 when the getter material has an electrical resistivity lower than that of the heating material. Such an electrically insulating layer is for example based on silicon oxide and/or nitride and has, for example, a thickness between around 100 nm and 1 µm. The layer 108 is also structured so as to form openings 114 through the getter material layer 108, forming access to the sacrificial layer 104 by means of openings 306 formed through the heating material layer 308.

The getter material layer 108 is therefore in this case isolated from the substrate 302 and supported by the support formed by the layer 308, the peripheral wall 310 and the heating material spacers 312. The density of the spacers 312 and/or the dimensions of these pillars 312 are adapted to the additional mechanical stresses due to the presence of the heating material layer 308 in addition to the getter material layer 108.

The sacrificial layer 104 is then removed, for example by etching through the openings 306 and the openings 114, thus freeing the structure formed by the heating material and the getter material. A cavity 316 formed under the layer 308 is thus obtained, in which the spacers 312 are arranged. The peripheral wall 310 in this case defines the cavity 316.

Figure 13:
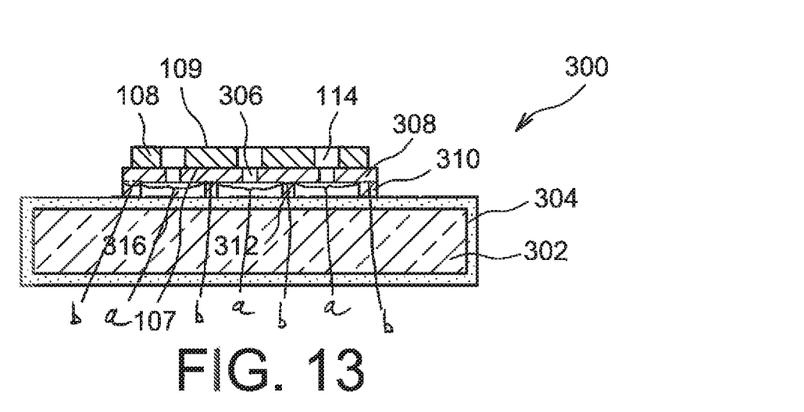

As in the previous embodiments, the getter structure 300 is then integrated on a substrate comprising a cavity in which a microelectronic device is arranged, thus forming a wall of the cavity (FIG. 13). The getter material of the structure 300, i.e. in this case the layer 308, is also thermally activated by passing a current through the heating material layer 308. One or more contacts can in particular be produced through a via hole formed in the substrate 302 in order to contact the heating material so as to be capable of bringing the current into the heating material layer 308. The gas absorption is therefore achieved in particular by the second face 109 of the getter material layer 108.

The invention claimed is:

1. A getter structure comprising a substrate and at least one getter material-based layer mechanically connected to the substrate by means of at least one support, in which the surface of the support in contact with the substrate is smaller than the surface of a first face of the getter material layer, in which said first face is in contact with the support, and a second face of the getter material layer, opposite said first face is at least partially exposed, wherein the support comprises at least one structured layer based on at least one resistive material and at least one pillar arranged between the resistive layer and the substrate, and the getter material layer is arranged against the resistive layer, wherein the pillar comprises, in a plane parallel to the plane of the main face of the getter material layer, a cross-section of which the surface is between around 4 µm² and 25 µm².

2. The structure according to claim 1, wherein the getter material layer has the support as the only conductive thermal bridge.

3. The structure according to claim 1, in which the substrate is glass-based.

4. The structure according to claim 1, in which the getter material-based layer has a thickness between around 0.2 µm and 2 µm.

5. The structure according to claim 1, in which the getter material is titanium- and/or zirconium- and/or hafnium-based.

6. The structure according to claim 1, in which the support is at least partially based on a getter material.

7. The structure according to claim 1, in which the pillar is based on resistive material.

8. The structure according to claim 1, in which the structuring pattern of the resistive layer is a serpentine pattern.

9. The structure according to claim 1, in which the getter material layer is structured according to a pattern substantially similar to that of the resistive layer.

10. The structure according to claim 1, in which, when the support comprises a plurality of pillars, two adjacent pillars are separated from one another by a distance between around 20 µm and 50 µm.

11. The structure according to claim 1, also comprising a thermal insulation layer and an adhesion layer arranged between the support and the getter material layer and/or between the support and the substrate.

12. The structure according to claim 11, in which the thermal insulation layer is based on a semiconductor oxide and/or the adhesion layer is based on titanium and/or chromium and/or zirconium.

13. The structure according to claim 1, in which the substrate is based on at least one material transparent to at least one wavelength capable of being absorbed by the getter material.

14. A microelectronic system comprising at least one cavity defined by walls and in which at least one microelectronic device is arranged, in which at least one wall of the cavity is formed by a getter structure according to claim 1, and the getter material layer of the getter structure is arranged in the cavity.

15. The system according to claim 14, in which the microelectronic device is arranged at a wall of the cavity other than the one formed by the getter structure.

16. The system according to claim 14, in which the microelectronic device comprises at least one MEMS and/or one NEMS.

17. The structure according to claim 1, in which the support comprises a peripheral wall of a cavity arranged between the getter material layer and the substrate.

18. The structure according to claim 17, also comprising at least one opening made through the getter material layer, forming an access to the cavity.

19. A process for producing the structure of claim 1 comprising at least the steps of:
   depositing a sacrificial layer on the substrate;
   depositing a getter material, forming the at least one getter material-based layer so that the sacrificial layer is arranged between the getter material layer and the substrate;
   at least partially removing the sacrificial layer, forming the support mechanically connecting the getter material layer to the substrate, in which the surface of the support in contact with the substrate is smaller than the surface of the first face of the getter material layer, in which said face is in contact with the support;

and the second face of the getter material layer opposite said first face is at least partially exposed;

depositing a layer based on at least one resistive material on the sacrificial layer or on the getter material layer, implemented between the step of depositing the sacrificial layer and the step of depositing the getter material or between the step of depositing the getter material and the step of removing a portion of the sacrificial layer, in which the getter material layer is arranged on or under the resistive layer; and after the step of depositing the resistive layer, a step of structuring the resistive layer and/or a step of producing openings through the resistive layer.

20. The process according to claim 19, in which the surface of the face of the getter material layer in contact with the support is smaller than the surface of the face of the getter material layer which is not in contact with the support.

21. The process according to claim 19, wherein the getter material layer has the support as the only conductive thermal bridge.

22. The process according to claim 19, also comprising, between the step of depositing the sacrificial layer and the step of depositing the getter material, a step of producing at least one opening through the sacrificial layer, in which the deposition of the getter material is also performed in the opening, and the getter material deposited in the opening forms at least a portion of the support.

23. The process according to claim 22, in which the production of the opening through the sacrificial layer and/or the production of the opening through the getter material is achieved by at least one lithography step and one etching step.

24. The process according to claim 19, also comprising, between the step of depositing the getter material and the step of removing the portion of the sacrificial layer, a step of producing at least one opening through the getter material, forming an access to the sacrificial layer, in which the removal of the sacrificial layer portion is performed at least by means of this opening.

25. The process according to claim 19, in which the remaining portion(s) of the sacrificial layer form(s), after the step of removing a portion of the sacrificial layer, at least one portion of the support.

26. The process according to claim 19, which also comprises, between the step of depositing the sacrificial layer and the step of depositing the getter material, a step of structuring the sacrificial layer.

27. The process according to claim 19, which also comprises, between the step of depositing the getter material and the step of removing a portion of the sacrificial layer, a step of structuring the getter material layer.

28. The process according to claim 19, which also comprises a step of depositing a thermal insulation layer and/or an adhesion layer on the support, implemented between the step of depositing the sacrificial layer and the step of depositing the getter material, and/or on the substrate, implemented before the step of depositing the sacrificial layer.

29. The process according to claim 19, in which the deposition of the getter material is performed by evaporation and/or spraying.

30. The process according to claim 19, in which the removal of the portion of the sacrificial layer is performed by a step of plasma etching or wet etching.

31. The process according to claim 19, which also comprises, after the step of depositing the getter material, a step of depositing a protective layer on the getter material, and a step of removing the protective layer implemented after the step of removing a portion of the sacrificial layer.

32. A process for producing a microelectronic system, comprising at least the steps of:

implementing a process for producing a getter structure according to claim 19;

closing a cavity defined by walls in which at least one microelectronic device is arranged, and in which the getter structure forms a wall of the cavity, and the getter material layer of the getter structure is arranged in the cavity.

33. The process according to claim 32, in which the microelectronic device is arranged at a wall of the cavity other than the one formed by the getter structure.

* * * * *